United States Patent [19]
Johansen et al.

[11] Patent Number: 5,877,933
[45] Date of Patent: Mar. 2, 1999

[54] ELECTROSTATIC DISCHARGE PROTECTION DEVICE FOR MAGNETORESISTIVE HEAD

[76] Inventors: Arnold W. Johansen, 226 Stow Rd., Marlboro, Mass. 01752; David V. Cronin, 7 Hampshire Rd., Peabody, Mass. 01960

[21] Appl. No.: 834,449

[22] Filed: Apr. 16, 1997

[51] Int. Cl.[6] .................................................. H01G 3/00
[52] U.S. Cl. ........................................ 361/220; 361/212
[58] Field of Search .................................. 361/212, 220, 361/816; 439/103, 186

[56] References Cited

U.S. PATENT DOCUMENTS

| | | | |
|---|---|---|---|
| 3,467,940 | 9/1969 | Wallo | 339/14 |
| 3,653,498 | 4/1972 | Kisor | 206/46 H |
| 3,774,075 | 11/1973 | Medesha | 317/2 R |
| 3,869,191 | 3/1975 | Tohnar, Jr. et al. | 439/186 |
| 4,019,094 | 4/1977 | Dinger et al. | 361/220 |
| 4,617,605 | 10/1986 | Obrecht et al. | 361/220 |
| 4,971,568 | 11/1990 | Cronin | 439/188 |
| 5,108,299 | 4/1992 | Cronin | 439/188 |
| 5,163,850 | 11/1992 | Cronin | 439/507 |
| 5,164,880 | 11/1992 | Cronin | 361/220 |
| 5,193,047 | 3/1993 | Barratt et al. | 361/212 |
| 5,259,777 | 11/1993 | Schuder et al. | 439/188 |
| 5,289,336 | 2/1994 | Gagliano | 361/220 |
| 5,299,942 | 4/1994 | Burke et al. | 439/79 |
| 5,465,186 | 11/1995 | Bajorek et al. | 360/113 |
| 5,490,033 | 2/1996 | Cronin | 361/212 |
| 5,491,605 | 2/1996 | Hughbanks et al. | 360/113 |
| 5,562,489 | 10/1996 | Cronin | 439/507 |
| 5,583,733 | 12/1996 | Cronin | 361/111 |
| 5,599,205 | 2/1997 | Cronin | 439/507 |
| 5,710,682 | 1/1998 | Arya et al. | 360/106 |

FOREIGN PATENT DOCUMENTS

| | | |
|---|---|---|
| 2348630 | 3/1975 | Germany . |
| 59-13353 | 1/1984 | Japan . |
| 61-148852 | 11/1986 | Japan . |
| 62-276855 | 1/1987 | Japan . |

OTHER PUBLICATIONS

Middlebrook, Carlton G., "Electrical Shorting Cap," *Navy Technical Disclosure Bulletin*, vol. 6, No. 3, Mar. 1981, pp. 33–36 (Navy Technology Catalog No. 5260 1530, Navy Case No. 63818).

Wang, Shay–Ping T., and Ogden, Paul, "Membrane–Type Pin Protector for Pin Grid Array Devices," 1991 IEEE/SEMI Advanced Semiconductor Manufacturing Conference, pp. 120–127.

*Primary Examiner*—Jeffrey Gaffin
*Assistant Examiner*—Kim Huynh
*Attorney, Agent, or Firm*—Joseph Stecewycz; Christopher P. Ricci

[57] ABSTRACT

An electrostatic discharge protection device is disclosed which selectively shunts charge accumulation across electrical conductors emplaced within the device housing. A grounding element is provided on the housing surface which maintains electrical contact with the enclosed electrical conductors so as to form a shorting shunt and place the conductors at substantially similar electrical potentials. The grounding element may be reversibly changed from the operative into an inoperative position to remove the grounding element from electrical contact with the electrical conductors.

19 Claims, 5 Drawing Sheets

ELECTROSTATIC DISCHARGE PROTECTION DEVICE FOR MAGNETORESISTIVE HEAD

BACKGROUND OF THE INVENTION

The present invention relates generally to electrostatic discharge protection devices and, more particularly, to electrostatic discharge protection devices suitable for use with electronic components containing electrical conductors or wires.

During the fabrication processes of conventional electronic components there may occur a build-up of electrostatic charges on device surfaces. When this electrostatic charge becomes substantial, an electrostatic discharge (ESD) may occur. The effects of an electrostatic discharge, which results in a substantial voltage spike, can permanently damage precision devices such as magnetoresistive (MR) heads used in magnetic storage devices.

Electrostatic charge may be produced when certain materials, such as plastics, are handled during manufacture. In an MR head, for example, the ESD may cause arcing across the edge of the insulating layer between the magnetic pole tips and adjacent conductive layers. This results in an erosion of the pole tips and degradation of the transducer, or may even cause destruction of the MR head.

U.S. Pat. No. 5,465,186 "Shorted magnetoresistive head leads for electrical overstress and electrostatic discharge protection during manufacture of a magnetic storage system," issued to Bajorek et al., discloses a MR sensor element in which the conductive leads are shorted together to provide a low resistance, conductive path bypassing the MR element so as to minimize electrical current through the MR element during discharge of static electrical charge. This approach, however, does not provide for the easy removal of the short circuit and requires changes to the process steps followed in fabrication of the MR head.

Further, if electrical testing of the electronic component is to be performed, the electrostatic discharge protection device must be removed. In most conventional ESD protection devices, the removal is permanent and leaves the electronic component vulnerable to ESD damage after testing has been completed. There does not appear to have been disclosed an electrostatic discharge protection device which provides for the electrical shorting of MR head elements without requiring process changes and which allows for the easy removal of the electrical shorting elements.

Other devices and methods of providing electrostatic discharge protection for various semiconductor packages are found in commonly assigned patents issued to David V. Cronin including: U.S. Pat. No. 5,108,299 "Electrostatic discharge protection devices for semiconductor chip packages," issued Apr. 28, 1992; U.S. Pat. No. 4,971,568 "Electrical connector with attachment for automatically shorting select conductors upon disconnection of connector," issued Sep. 20, 1990; U.S. Pat. No. 5,163,850 "Electrostatic discharge protection devices for semiconductor chip packages," issued Nov. 17, 1992; U.S. Pat. No. 5,164,880 "Electrostatic discharge protection device for printed circuit board," issued Nov. 17, 1992 and pending U.S. application Ser. Nos. 08/234,917 filed Apr. 28, 1994, and 08/278,024 and 08/278,063 both filed Jul. 20, 1994. These electrostatic discharge protection devices are most generally suitable for attachment to a connector or to a receptacle and not to the electrical conductors themselves. Thus, there remains the risk of damage from an ESD occurring on the electrical conductors.

Accordingly, it is an object of this invention to provide a device which serves to minimize ESD damage to electronic components containing electrical conductors.

It is another object of this invention to provide such a device which electrically connects to electrical conductors and may be temporarily disconnected to allow for electrical testing of the electronic component.

It is a further object of this invention to provide such a device which does not require extensive process changes in the fabrication of the electronic component. These and other objects of the invention will be obvious and will appear hereinafter.

SUMMARY

The aforementioned and other objects are achieved by an electrostatic discharge protection device, comprises a housing and a grounding element, which selectively inhibits electrostatic charge accumulation on electrical conductors. The electrical conductors are mechanically secured and electrically isolated from one another within the housing, which is preferably fabricated of a nonconductive material, by placement into conduits. Stretcher elements are placed across the electrical conductors so as to place the electrical conductors into tension to further insure electrical isolation.

In further aspects, the invention provides methods in accord with the apparatus described above. The aforementioned and other aspects of the invention are evident in the drawings and in the description that follows.

BRIEF DESCRIPTION OF THE DRAWINGS

The foregoing and other objects of this invention, the various features thereof, as well as the invention itself, may be more fully understood from the following description, when read together with the accompanying drawings in which.

DETAILED DESCRIPTION

While the present invention retains utility within a wide variety of circuit board and conductor configurations and may be embodied in different forms, it is advantageously employed in connection with conductive elements such as exposed wires. Although this is the form of the preferred embodiment and will be described as such, this embodiment should be considered illustrative and not restrictive. One skilled in the art will realize that the wires discussed herein are only one form of conductive elements that will benefit from the invention.

Figure 1:
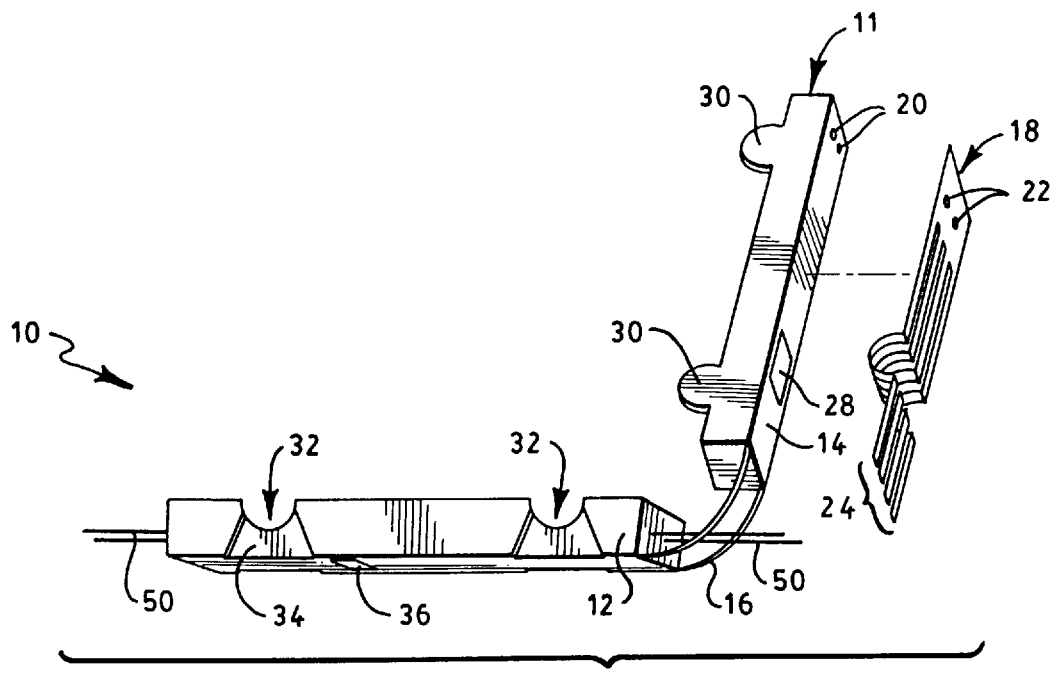
FIG. 1 shows a side view of the operative elements of the invention illustrating a housing comprising a bottom section flexibly connected to a top section.

Referring now to FIG. 1, an electrostatic discharge protection device 10 is shown comprising a housing 11 and a grounding element 18. Grounding element 18 is preferably fabricated from a conductive material or, alternatively, from a non-conductive material coated with a conductive material. A suitable conductive material is beryllium copper, which has an inherent resilient bias. Housing 11 comprises a bottom section 12 flexibly connected with a top section 14 via a hinge 16. In the preferred embodiment, housing 11 is fabricated of a non-conductive material which substantially inhibits electrical conduction across device 10. One skilled in the art will, however, realize that any one of a number of alternative fabrication methods can be used to produce housing 11, such as coating with an insulator or by using non-conductive sleeves through which enclosed conductive elements may pass. Any such design can be used as long as electrical isolation between the conductive elements is maintained within the housing absent a shunting mechanism.

Grounding element 18 comprises one or more holes 22 which mate with corresponding protrusions 20 when securing grounding element 18 to top section 14. ESD protection is provided by placing contact segments 26, which extend transverse from a rear surface of grounding element 18, into a contact aperture 28 extending through top section 14. Contact aperture 28 provides a means of access to emplaced conductive elements 50 for contact segments 26 which serve to place each of conductive elements 50 at essentially the same electrical potential. The operative position of electrostatic discharge protection device 10 occurs when grounding element 18 lies across conductive elements 50.

Figure 2:
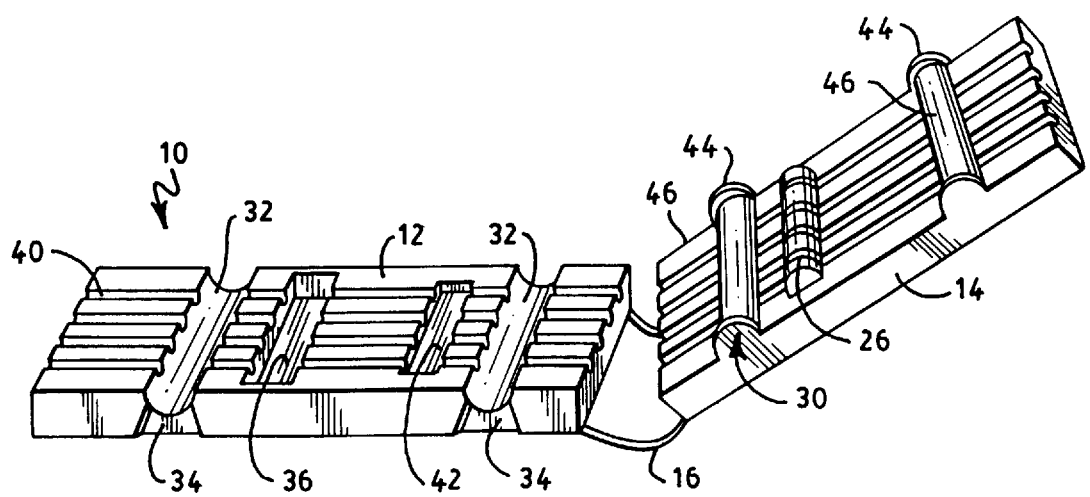
FIG. 2 shows a perspective view of the invention according to FIG. 1 in an open configuration.
Figure 3:
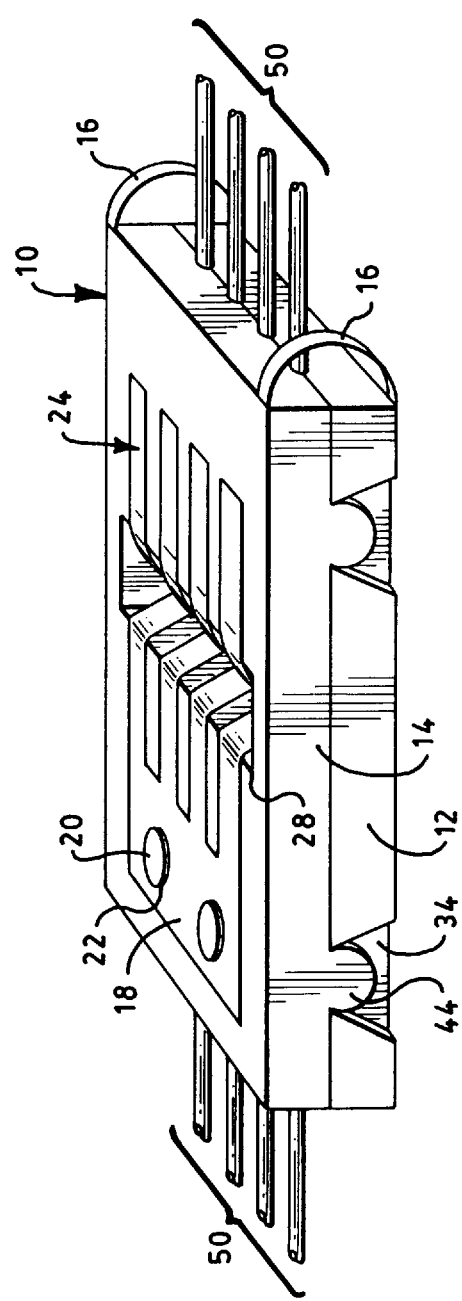
FIG. 3 shows a perspective view of the invention according to FIG. 1 in a closed configuration illustrating placement of a grounding element on the housing.

As can be more readily seen in FIGS. 2 and 3, conductive elements 50 are secured within one or more conduits 40 in electrostatic discharge protection device 10 when top section 14 is rotated relative to hinge 16 and mated with bottom section 12. Top section 14 comprises one or more protrusions 30, which extend from an inside surface of top section 14 and interlock with respective receptors 32 in bottom section 12.

Protrusion 30 comprises a locking member 44 and a stretching cylinder 46. When top section 14 is mated with bottom section 12, each locking member 44 is pressed into a corresponding recessed triangular frustum 34 to secure top section 14 to bottom section 12. Conduits 40 serve to separate and position conductive elements 50 axially along housing 11. When electrostatic discharge protection device 10 is closed, each stretching cylinder 46 projects into one corresponding receptor 32 and causes conductive elements 50 to stretch slightly between both stretching cylinders 46. This stretching action causes a tension in the conductive elements 50 and serves to remove existing slack. Conductive elements 50 remain taut within contact aperture 28 to assure electrical contact with contact segments 26. Contact segments 26 protrude into a wire recess 42 so as to more positively provide electrical contact with conductive elements 50. This increases tension in conductive elements 50 and further serves to maintain their physical separation.

Figure 4:
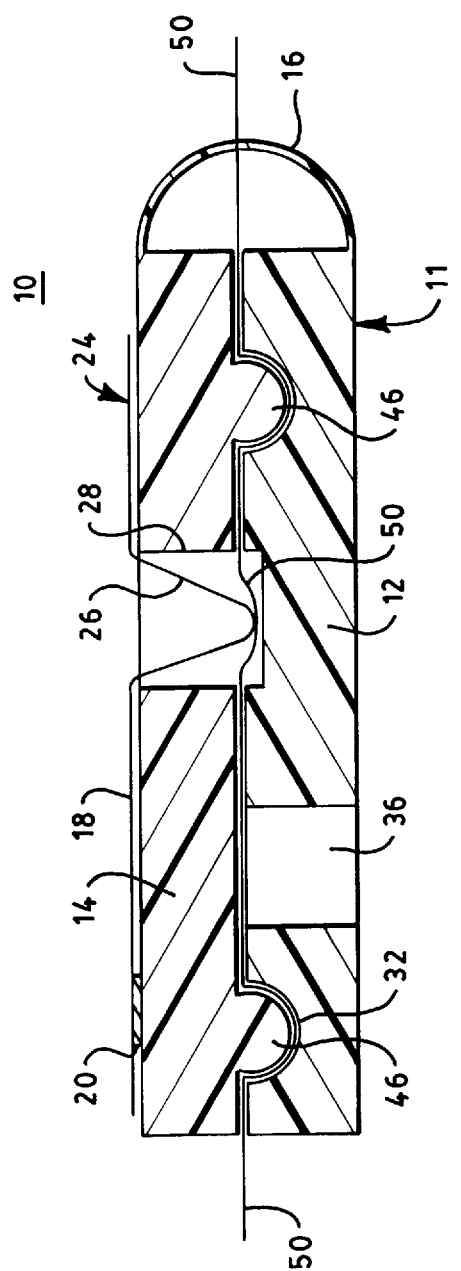
FIG. 4 shows a cross sectional view of the invention according to FIG. 3.

FIG. 4 shows a closed electrostatic discharge protection device 10 in cross-sectional view. Conductive elements 50 pass around stretching cylinders 46 and contact segment 26 of grounding element 18. A test port 36 comprises an aperture through bottom section 12 and provides external access to conductive elements 50, such as required for electrical testing purposes, without incurring the need to open device 10. When electrical testing is required, grounding element 18 is moved from the operative position shown.

Figure 5A:
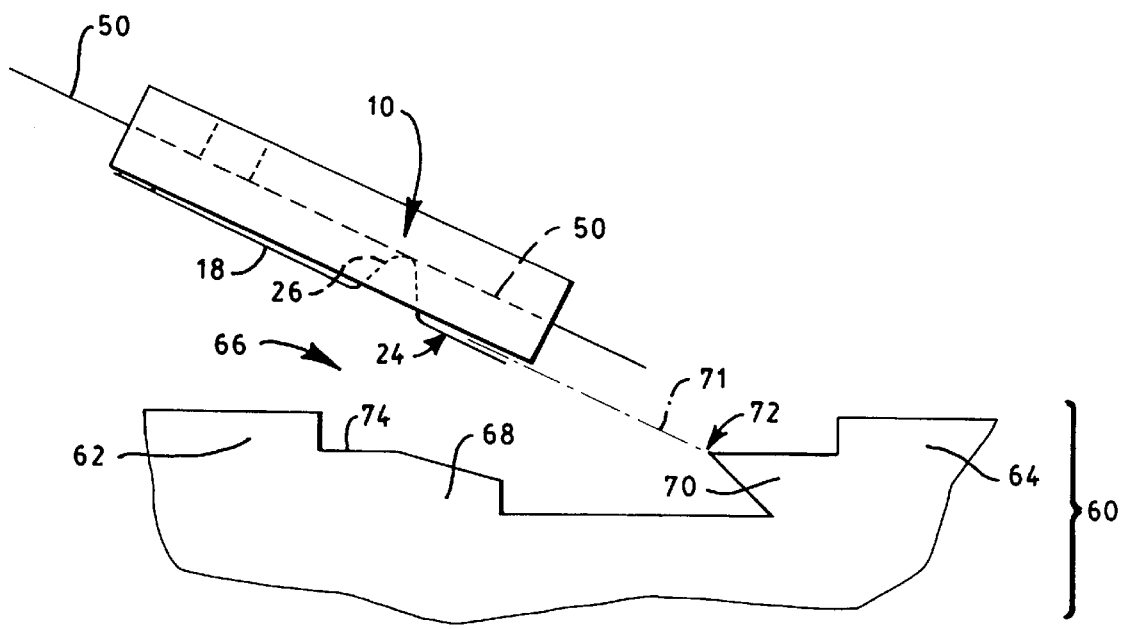
FIGS. 5A and 5B show the steps taken in emplacing the invention into a test tool.

FIG. 5A illustrates one configuration of a test tool 60 which can be used with electrostatic discharge protection device 10. Test tool 60 displaces grounding element 18 from its operative position (i.e., in electrical contact with conductive elements 50) to an inoperative position (i.e., not in electrical contact with conductive elements 50) and electrical isolates conductive elements 50. Test tool 60 may comprise a recess 66 formed by a first wall 62 and a second wall 64. During operation, electrostatic discharge protection device 10 is inserted into recess 66 as shown. This action causes the apex 72 of a wedge 70 to be interposed between shorting arms 24 and electrostatic discharge protection device 10, and accordingly, grounding element 18 is urged away from top section 14. A shim 68, which lies within recess 66, further facilitates the separation of grounding element 18 from top section 14.

Figure 5B:
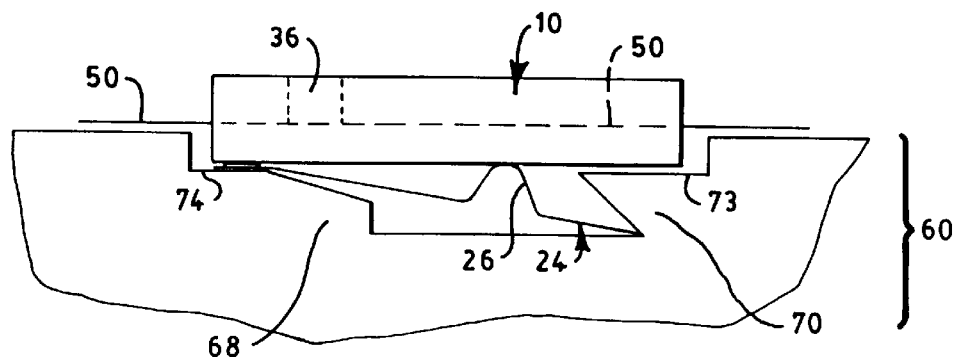

When fully positioned within test tool 60, as best seen in FIG. 5B, electrostatic discharge protection device 10 rests on a first flat surface 74 and a second flat surface 73, and is substantially secured between the wall 62 and second wall 64 by frictional contact. In this position, contact segment 26 has been displaced from conductive elements 50 and a test probe (not shown) can be inserted into test port 36 as required. The test probe is thus able to individually access any conductive elements 50. Removal of electrostatic discharge protection device 10 from test tool 60 moves grounding element 18 back into the operative position. In an alternative embodiment of test tool 60 (not shown), wedge 70 is moveable rather than fixed. In operation, electrostatic discharge protection device 10 is first placed on first and second flat surfaces 74, 73 and wedge 70 is then moved into position in the direction of shim 68.

In a typical application, the electronic component to which the conductive elements 50 are connected is placed into circuitry and permanent electrical connections may be made. For example, when an MR head is secured to a gimbal structure for used in a mass storage device, separate wires are used to connect the MR head to the circuitry. In such cases, electrostatic discharge protection device 10 is removed to enable the MR head to operate properly. Since separate wires are used, conductive elements 50 are severed with the electrostatic discharge protection device 10 and electrical isolation is provided to the electrical contacts on the MR head. If conductive elements 50 are the means by which the electronic component is connected into circuitry, grounding element 18 is permanently moved into the inoperative position.

Figure 6A:
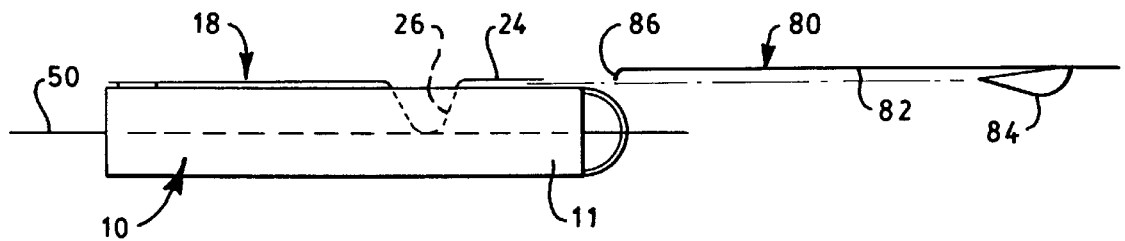
FIGS. 6A, 6B and 6C show the invention according to FIG. 3 in which an interrupter element is emplaced so as to retain the grounding element in an inoperative position.
Figure 6B:
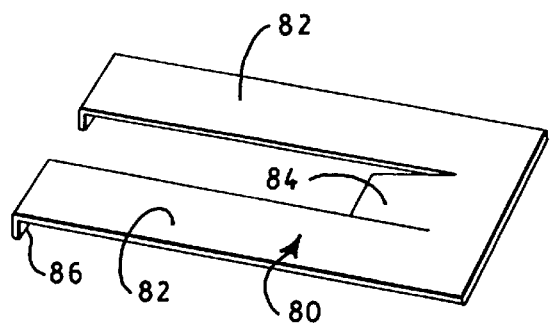
Figure 6C:
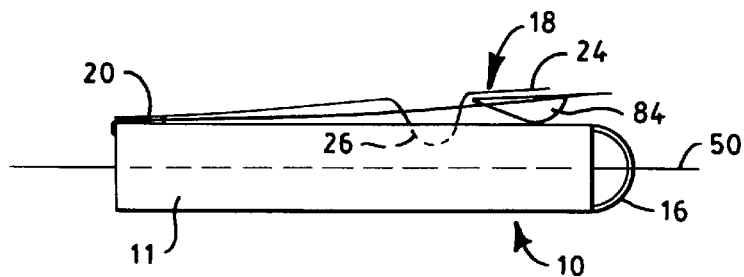

FIGS. 6A–6C show one embodiment of an interrupter 80 which provides this permanent positioning. Interrupter 80 interposes a wedge 84 between shorting arms 24 and housing 11. Wedge 84 overcomes the bias of shorting arms 24 and moves contact segment 26 upward away from conductive elements 50.

Interrupter 80 has securing legs 82 which extend along an outer periphery of grounding element 18 between grounding element 18 and housing 11. Securing legs 82 terminate in gripping arms 86 which extend at an angle from securing legs 82. Gripping arms 86 form an interference fit with housing 11 to hold interrupter 80 in place. Additionally, since the bias of shorting arms 24 is downward against wedge 84, the bias is translated by wedge 84 into a force moving interrupter 80 axially away from shorting arms 24. This force is counteracted by the hold of gripping arms 86 against housing 11, thus holding interrupter 80 securely in place.

The invention may be embodied in other specific forms without departing from the spirit or essential characteristics thereof. The present embodiments are, therefore, to be considered in all respects as illustrative and not restrictive, the scope of the invention being indicated by the appended claims rather than by the foregoing description, and all changes which come within the meaning and range of equivalency of the claims are therefore intended to be embraced therein.

The embodiments of the invention in which an exclusive property or privilege is claimed are defined as follows:

1. An electrostatic discharge protection device for selectively inhibiting electrostatic charge accumulation on conductive elements such as those disposed within a magnetoresistive head, said device comprising:

a housing comprising a top section and a bottom section, said sections interlocking to enclose the conductive elements, said housing further comprising a contact aperture providing external access to the conductive elements; and a grounding element comprising a contact segment, said grounding element secured to said housing and having an operative position and an inoperative position such that, in said operative position said contact segment protrudes into said contact aperture and makes electrical contact with the conductive elements, and in said inoperative position said contact segment makes no electrical contact with the conductive elements.

2. The electrostatic discharge protection device according to claim 1 wherein said housing further comprises a nonconductor.

3. The electrostatic discharge protection device according to claim 1 wherein said housing further comprises an insulative layer overlying said housing.

4. The electrostatic discharge protection device according to claim 1 wherein said housing further comprises conduits to maintain the conductive elements in physical separation.

5. The electrostatic discharge protection device according to claim 1 wherein said housing further comprises stretchers adapted to place said conductive elements into tension.

6. The electrostatic discharge protection device according to claim 1 wherein said top section further comprises a test port providing external access to the conductive elements.

7. The electrostatic discharge protection device according to claim 1 wherein said grounding element is reversibly actuable between said operative position and said inoperative position.

8. The electrostatic discharge protection device according to claim 1 further comprising a test tool, said test tool adapted to retain said grounding element in said inoperative position.

9. The electrostatic discharge protection device according to claim 8 wherein said housing further comprises a test port, said test port providing external access to said conductive elements.

10. The electrostatic discharge protection device according to claim 1 further comprising an interrupter, said interrupter disposed between said grounding element and said housing such that said grounding element is retained in said inoperative position.

11. The electrostatic discharge protection device according to claim 10 wherein said interrupter comprises gripping arms extending at an angle from said interrupter.

12. An electrostatic discharge protection device for selectively inhibiting electrostatic charge accumulation on conductive elements such as those disposed within a magnetoresistive head, said electrostatic discharge protection device comprising:

a housing comprising a top section, a bottom section, and a hinge connecting said top section and said bottom section such that said top section can be rotated relative to said bottom section and interlocked to said bottom section such that the conductive elements placed between said sections are secured therebetween; and a grounding element disposed on said housing and having an operative position and an inoperative position such that, in said operative position said grounding element makes electrical contact with the conductive elements, and in said inoperative position said grounding element makes no electrical contact with the conductive elements.

13. The electrostatic discharge protection device according to claim 12 wherein said housing further comprises conduits to maintain the conductive elements in physical separation.

14. The electrostatic discharge protection device according to claim 12 wherein said housing further comprises stretchers adapted to place said conductive elements into tension.

15. The electrostatic discharge protection device according to claim 12 wherein said grounding element is reversibly actuable between said operative position and said inoperative position.

16. The electrostatic discharge protection device according to claim 12 further comprising a test tool, said test tool adapted to retain said grounding element in said inoperative position.

17. The electrostatic discharge protection device according to claim 16 wherein said housing further comprises a test port, said test port providing external access to said conductive elements.

18. The electrostatic discharge protection device according to claim 12 wherein the electrostatic discharge protection device is used in combination with an interrupter, where the interrupter is insertable between the grounding element and the housing to move the grounding element into the inoperative position.

19. The electrostatic discharge protection device according to claim 12 wherein said housing further comprises a contact aperture, said contact aperture providing external access to the conductive elements.

* * * * *